United States Patent [19]

Molyneux-Berry

[11] 4,286,314

[45] Aug. 25, 1981

[54] INVERTER CIRCUIT FOR MINIMIZING SWITCHING POWER LOSSES

[75] Inventor: Robert B. Molyneux-Berry, Danbury, England

[73] Assignee: The Marconi Company Limited, Chelmsford, England

[21] Appl. No.: 58,522

[22] Filed: Jul. 18, 1979

[30] Foreign Application Priority Data

Jul. 20, 1978 [GB] United Kingdom ............... 30482/78

[51] Int. Cl.³ .............................................. H02M 1/18
[52] U.S. Cl. .................................................... 363/55
[58] Field of Search ............................. 361/3, 8, 9, 13; 363/15, 18-24, 55-58, 124

[56] References Cited

U.S. PATENT DOCUMENTS

| | | | |
|---|---|---|---|
| 3,530,503 | 9/1970 | Appelo et al. | 363/124 X |
| 4,028,610 | 6/1977 | Cord'Homme | 363/57 |
| 4,156,274 | 5/1979 | Fukui et al. | 363/58 |
| 4,167,776 | 9/1979 | Nygaard | 363/56 |

FOREIGN PATENT DOCUMENTS 584409  3/1978  U.S.S.R. ..................... 363/56

*Primary Examiner*—A. D. Pellinen
*Attorney, Agent, or Firm*—Diller, Ramik & Wight

[57] ABSTRACT

Because inverter circuits utilize switches which can be adversely affected by signal transients or excessive voltages, it is usual to provide a protective circuit consisting of a capacitor and a resistor. At high frequencies and high powers the energy dissipated in the resistor can be excessive. The present invention provides an additional switch, which is arranged to discharge the capacitor in a lossless manner and to return the energy stored by the capacitor to the power supply by making the discharge path part of a resonant circuit, loss can be reduced to negligible levels.

6 Claims, 4 Drawing Figures

INVERTER CIRCUIT FOR MINIMIZING SWITCHING POWER LOSSES

This invention relates to inverter circuits and is particularly suitable for use in inverter circuits which operate at high frequency to provide very high power to a load. Inverter circuits are being increasingly adopted for power regulation purposes, since they are theoretically capable of operating in a very efficient manner, but because it is generally necessary to incorporate a protection circuit having a resistive element to protect the switch which forms the basis of an inverter circuit, a certain amount of power is nevertheless wastefully dissipated. The wasteful dissipation of power increases significantly as inverters operate at higher overall power levels and at higher frequencies. The way in which the losses arise is explained with reference to the accompanying FIG. 1.

Figure 1:
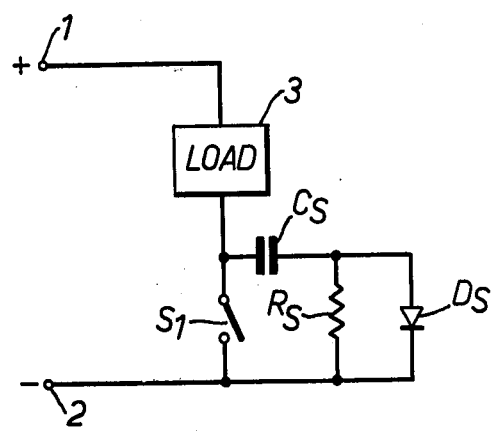

Referring to FIG. 1, a known inverter is connected to a power source at terminals 1 and 2 and consists of a switch $S_1$ which is connected in series with a load 3 across the terminals 1 and 2. A capacitor $C_S$ is connected in series with a resistor $R_S$ and both are connected in shunt with the switch $S_1$. A diode $D_S$ is connected across the resistor $R_S$. The presence of the capacitor $C_S$ reduces the risk of unintentional reapplication of forward voltage across the switch $S_1$ at an excessive rate or to an excessive extent during the period that the switch is either non conductive or is ceasing to conduct. Such excessive reapplication of forward voltage may be due to residual current in the load, which is often of an inductive nature or it may be due to undesired transients or switching actions present in the system. The capacitor reduces the risk that the switch will be either damaged or undesirably rendered conductive, and the diode $D_S$ is present to prevent undesirable resonant oscillations building up when the switch $S_1$ is initially closed, thereby allowing the capacitor $C_S$ to discharge via $R_S$. The diode $D_S$ in addition to preventing reverse current flow under this condition also allows forward current to flow to prevent or reduce the risk of reapplication of forward voltage across the switch at an excessive rate. Once switch $S_1$ is fully conductive the diode $D_S$ is cut off.

The energy stored in capacitor $C_S$ increases with the value of its capacitance and with the square of the peak voltage to which it is charged and thus energy is wasted when the capacitor discharges through resistor $R_S$. At high frequency and at high power the consequent power wasted in $R_S$ is significant and the present invention seeks to provide an inverter in which the power loss is inherently less.

According to this invention an inverter circuit includes a switch which is rendered conductive periodically so as to provide pulsed power from a power source to a load, a diode and a capacitor serially connected in a path which is in shunt with said switch, and a further switch coupled to said capacitor by means of which the capacitor is periodically discharged to return the energy stored by the capacitor to the power source.

Preferably an inductor is provided in series with the further switch so that it in combination with said capacitor forms a resonant circuit.

Preferably again, a diode is provided in combination with the capacitor so as to prevent it being charged from the power source when the further switch is conductive. Alternatively, the further switch may be of kind which incorporates a diode so that it only conducts in the one direction.

Preferably again, means are provided for limiting the peak potential to which the capacitor is charged to a predetermined value.

Typically the predetermined value is twice the value of the potential provided by the power source.

Figure 2:
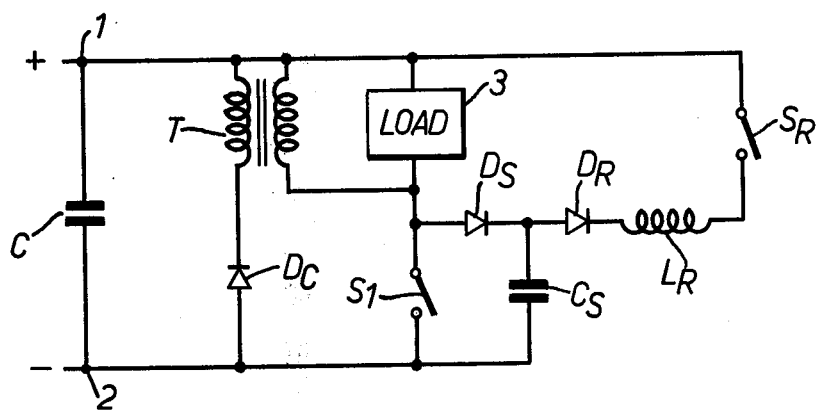
Figure 3:
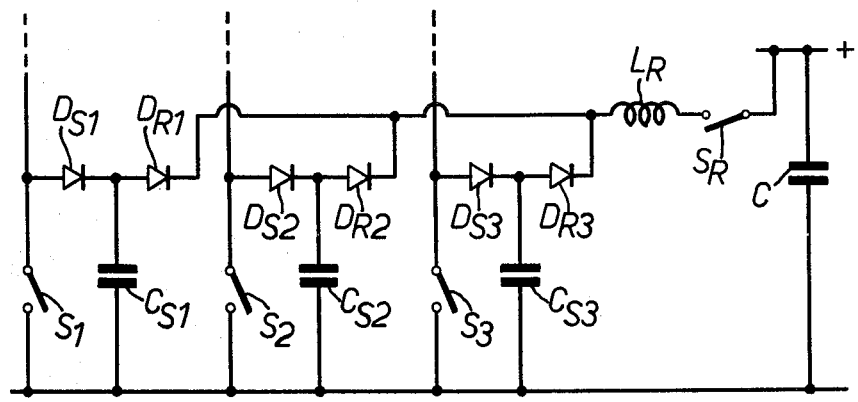
Figure 4:
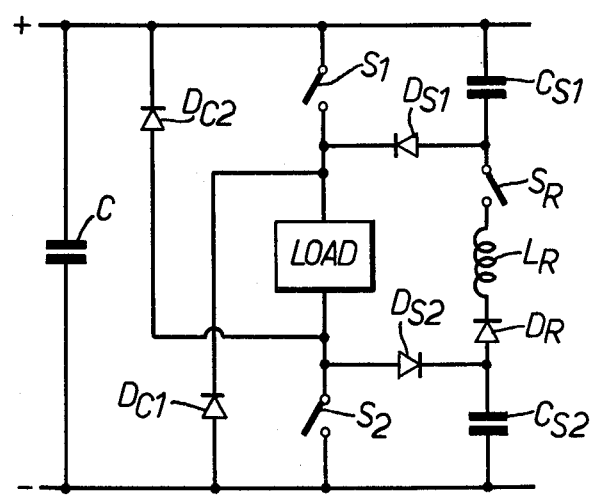

The invention is further described by way of example with reference to the accompanying drawings in which, FIG. 1 illustrates a prior art inverter, FIG. 2 illustrates an inverter circuit in accordance with the present invention and FIGS. 3 and 4 illustrate modifications thereof.

Referring to FIG. 2, the terminals 1 and 2 are connected to a power source in the same manner as in FIG. 1 and a supply capacitor C is connected between terminals 1 and 2. A load 3 and a switch $S_1$ are connected in series across the terminals 1 and 2 and a diode $D_S$ and a capacitor $C_S$ are connected in series with each other so as to be in shunt with the switch $S_1$. A further diode $D_R$, an inductor $L_R$ and a switch $S_R$ are connected in series between the junction points of diode $D_S$ and the capacitor $C_S$ and the terminal 1. A voltage limiting circuit consisting of a tightly coupled trimming transformer T and a diode $D_C$ is connected across terminals 1 and 2 with the secondary winding of the transformer T connected across the load 3.

During normal operation of the inverter, the switch $S_1$ is closed periodically at the pulse repetition rate of the inverter, and it is held closed for that proportion of the pulse repetition period which is necessary to provide the required pulsating power level to the load 3. The further switch $S_R$ is rendered conductive at the same pulse repetition frequency as the switch $S_1$ and it may be rendered conductive at the same instant as switch $S_1$ or alternatively at any suitable time, whilst switch $S_1$ is already conductive. The transformer T ensures that when $S_1$ is non conductive the capacitor $C_S$ charges to twice the supply voltage. When switch $S_R$ is closed a half sine wave of current will flow in the resonant circuit consisting of capacitor $C_S$, diode $D_R$, inductor $L_R$ and the further switch $S_R$. If this resonant circuit is lossless the capacitor $C_S$ will exactly discharge to zero volts and all energy stored in it will be returned to the supply capacitor C. In practice, the discharge may not be perfectly lossless, in which case the capacitor C would retain a small residual charge. If the residual charge is unacceptably high, the initial voltage to which the capacitor $C_S$ is allowed to charge may be adjusted by modifying the turns ratio of the transformer T. The value of inductor $L_R$ is chosen to determine the time within which the discharge of capacitor $C_S$ is completed and normally this is no greater than the minimum period for which the switch $S_1$ conducts. The diode $D_R$ prevents capacitor $C_S$ recharging from the supply source. Although diode $D_R$ is shown as a separate diode it may in practice be incorporated within the switch $S_R$ which may be a unidirectional switch. In this case $D_R$ can be omitted.

The trimming transformer T in FIG. 2 serves to limit the maximum voltage on capacitor $C_S$ to twice the potential of the power source in known manner. Alternative methods exist for restricting the voltage on the capacitor $C_S$ to a predetermined value, and instead of using the transformer T and the diode $D_C$ a further diode can be connected from the junction point between diode $D_S$ and capacitor $C_S$ to a further supply source having a voltage of twice that of the supply source connected across terminals 1 and 2.

In high power inverters, it may be desirable to provide more than one main switch $S_1$ and in such a case each switch would be provided with its own capacitor $C_S$ to give individual protection. The essential features of an arrangement of this kind are shown in FIG. 3, in which for the sake of economy a common energy recovery circuit is used. Each switch $S_1$, $S_2$, $S_3$ is provided with a pair of diodes $D_{S1}$, $D_{R1}$; $D_{S2}$, $D_{R2}$; and $D_{S3}$, $D_{R3}$ respectively. The diodes $D_{R1}$, $D_{R2}$, $D_{R3}$ are all connected to a common inductor $L_R$, which is coupled via a further switch $S_R$ to the power supply and the capacitor C. In this case the multiple diodes $D_{R1}$, $D_{R2}$, $D_{R3}$ are required and as many additional separate stages as are needed can be provided, subject to the condition that all capacitors discharge simultaneously.

It is possible to implement high power inverter circuits using switches arranged in series in single ended or bridge configurations and in such a case diode clipping arrangements of the kind shown in FIG. 4 can be advantageously used to determine the peak voltages to which the capacitor $C_S$ charge. In FIG. 4, the capacitor $C_{S1}$ will charge to the potential of negative supply rail and capacitor $C_{S2}$ will charge to the potential of the positive supply rail and it will be noted that no additional supply rails or clipping transformers are necessary. The capacitors $C_{S1}$ and $C_{S2}$ are discharged by losslessly resonating them with a common inductor $L_R$ connected as shown in series with a further switch $S_R$ so that the energy stored by the capacitors is returned to the supply capacitor C. The diode $D_R$ shown connected in series with the inductor $L_R$ may be dispensed with as previously mentioned if the switch $S_R$ is of a form which is unidirectionally conductive.

I claim:

1. An inverter circuit including a switch which is rendered conductive periodically so as to provide pulsed power from a power source to a load; a diode and a capacitor serially connected in a path which is in shunt with said switch, and a further switch coupled to said capacitor by means of which the capacitor is periodically discharged to return the energy stored by the capacitor to the power source, and wherein said capacitor and the further switch are connected in series across the input terminals of the inverter circuit to which, in use, power is applied from the power source so that when said further switch is rendered conductive, the energy stored by the capacitor flows through the further switch back to the power source.

2. An inverter circuit as claimed in claim 1 and wherein an inductor is provided in series with the further switch so that it in combination with said capacitor forms a resonant circuit.

3. An inverter circuit as claimed in claim 1 and wherein a diode is provided in combination with the capacitor so as to prevent it being charged from the power source when the further switch is conductive.

4. An inverter circuit as claimed in claim 1, and wherein means are provided for limiting the peak potential to which the capacitor is charged to a predetermined value.

5. An inverter circuit as claimed in claim 4 and wherein the predetermined value is twice the value of the potential provided by the power source.

6. In an inverter circuit having a pair of input terminals adapted to be connected to a d.c. power source, a load and a switch connected in series between said input terminals to provide pulsed power to the load, and a capacitor connected in shunt with said switch so as to accept a charge when said switch is non-conducting, the improvement which comprises:

a diode connected in series with said capacitor and forming therewith the shunt connection across said switch, and a further switch connected in series with said capacitor across said input terminals and operated in conjunction with said switch first mentioned for returning said charge to the source to minimize switching power losses due to normal operation of the inverter.

* * * * *